United States Patent
O'Brien

(10) Patent No.: US 6,429,737 B1
(45) Date of Patent: Aug. 6, 2002

(54) METHOD AND APPARATUS FOR MULTI-CHANNEL DIGITAL AMPLIFICATION

(75) Inventor: Thomas Joseph O'Brien, Limerick, PA (US)

(73) Assignee: STMicroelectronics, Inc., Carrollton, TX (US)

( * ) Notice: Subject to any disclaimer, the term of this patent is extended or adjusted under 35 U.S.C. 154(b) by 87 days.

(21) Appl. No.: 09/611,231

(22) Filed: Jul. 6, 2000

(51) Int. Cl.$^7$ ................................................ H03F 3/38
(52) U.S. Cl. ...................................... 330/10; 330/124 R
(58) Field of Search ............................... 330/10, 207 A, 330/251, 124 R; 375/238, 261

(56) References Cited

U.S. PATENT DOCUMENTS

| | | | | |
|---|---|---|---|---|
| 5,963,086 A | * | 10/1999 | Hall | 330/10 |
| 6,107,876 A | * | 8/2000 | O'Brien | 330/10 |
| 6,181,199 B1 | * | 1/2001 | Camp et al. | 330/10 |
| 6,229,388 B1 | * | 5/2001 | Nalbant | 330/124 R X |

* cited by examiner

*Primary Examiner*—Steven J. Mottola
(74) *Attorney, Agent, or Firm*—Michael A. Glenn; Lisa K. Jorgenson

(57) ABSTRACT

The invention provides a method and apparatus for the modulation of more than one channel of audio in a digital amplification system. In the preferred embodiment of the invention, pulse width modulator outputs are staggered in time such that at idle only one channel switches states at a time. This is done to provide an even draw from the power supply, assuming that the same supply is used for the multiple channels. For example, in a two channel system, the idle state of the pulse width modulator for the first channel is 90 degrees out of phase with the pulse width modulator output of the second channel.

23 Claims, 13 Drawing Sheets

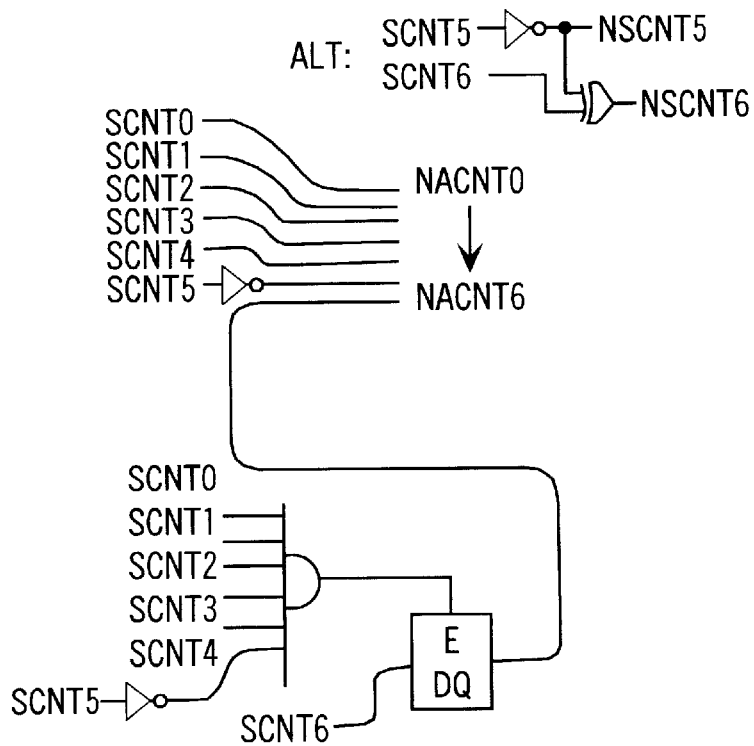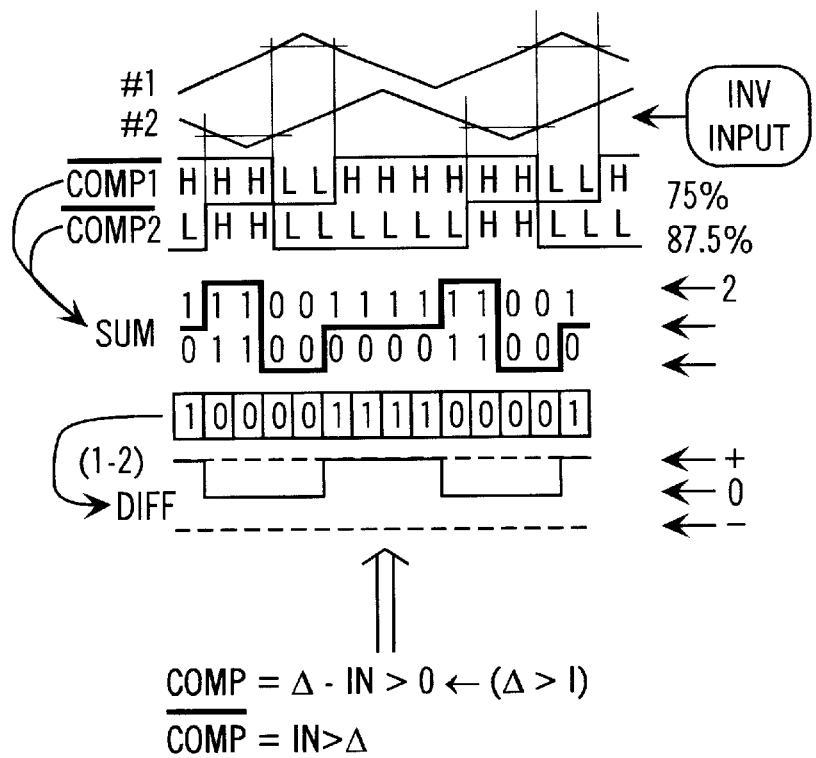
FIG. 9B

FIG. 11    DF OUTPUT EVERY 128 CY (352K)
INTERPOLATED EVERY 32 CY (1.4μ)

| SCNT 6→3 | SCNT4 6→3 | SCNTA 6→3 | SCNTB 6→3 | SCNTC 6→3 | SCNTD 6→3 | SCNTE 6→3 | SCNTF 6→3 | SCNTG 6→3 |
|---|---|---|---|---|---|---|---|---|
| A 0000 | 0000 | 0111 | 0010 | 0101 | 0100 | 0011 | 0010 | 0001 |
| B 0001 | 0001 | 1000 | 0111 | 0110 | 0101 | 0100 | 0011 | 0010 |
| C 0010 | 0010 | 1001 | 1000 | 0111 | 0110 | 0101 | 0100 | 0011 |
| D 0011 | 0011 | 1010 | 1001 | 1000 | 0111 | 0110 | 0101 | 0100 |
| E 0100 | 0100 | 1011 | 1010 | 1001 | 1000 | 0111 | 0110 | 0101 |
| F 0101 | 0101 | 1100 | 1011 | 1010 | 1001 | 1000 | 0111 | 0110 |
| G 0110 | 0110 | 1101 | 1100 | 1011 | 1010 | 1001 | 1000 | 0111 |
| H 0111 | 0111 | 1110 | 1101 | 1100 | 1011 | 1010 | 1001 | 1000 |
| A 1000 | 1000 | 1111 (+7) | 1110 (+6) | 1101 (+5) | 1100 (+4) | 1011 | 1010 | 1001 |
| B 1001 | 1001 | 0000 | 1111 | 1110 | 1101 | 1100 | 1011 | 1010 |
| C 1010 | 1010 | 0001 | 0000 | 1111 | 1110 | 1101 | 1100 | 1011 |
| D 1011 | 1011 | 0010 | 0001 | 0000 | 1111 | 1110 | 1101 | 1100 |
| E 1100 | 1100 | 0011 | 0010 | 0001 | 0000 | 1111 | 1110 | 1101 |
| F 1101 | 1101 | 0100 | 0011 | 0010 | 0001 | 0000 | 1111 | 1110 |
| G 1110 | 1110 | 0101 | 0100 | 0011 | 0010 | 0001 | 0000 | 1111 |
| H 1111 | 1111 | 0110 | 0101 | 0100 | 0011 | 0010 | 0001 | 0000 |
|  | ←+0 (CH7) | ←+7 (CH0) | ←+6 (CH1) | ←+5 (CH2) | ←+4 (CH3) | ←+3 (CH4) | ←+2 (CH5) | ←+1 (CH6) |

FIG. 14B

METHOD AND APPARATUS FOR MULTI-CHANNEL DIGITAL AMPLIFICATION

BACKGROUND OF THE INVENTION

1. Technical Field

The invention relates to amplifiers. More particularly, the invention relates to a method and apparatus for multi-channel digital amplification.

2. Description of the Prior Art

The current trend for audio information processing is to place most audio sources in the digital domain, rather than in the analog domain. That is, audio information is now usually stored in a digital format, instead of in an analog format.

Existing amplifier technology typically concentrates on efficiency. Such modern technology evolved from the primitive Class D amplifiers of the 1970s. Parallel developments in device technology have resulted in faster semiconductors and better topologies that allow the manufacture of lower distortion Class D, or "switching" audio amplifiers. However, these amplifiers have typically had an analog input only, and must incorporate feedback to compensate for distortion due to timing errors. Accordingly, digital input streams must first be converted to analog signal and then amplified with an analog Class D amplifier to create an efficient digital input amplifier.

One approach to processing a digital signal pursuant to audio amplification uses an external digital-to-analog converter (DAC) for input conversion (the post-DAC portion of such a system is manufactured by Linfinity Microelectronics, Inc. 11861 Western Avenue, Garden Grove, Calif. 92841). Such audio amplification systems require analog feedback to have reasonable performance characteristics. The mixed-signal nature of this topology is inherently expensive to produce.

Another approach to processing a digital signal pursuant to audio amplification uses a digital signal processor (DSP) and a field programmable gate array (FPGA) configured as a power DAC capable of driving a loudspeaker (such system is manufactured by Apogee Technology, Inc. 129 Morgan Drive, Norwood, Ma. 02062). This approach is complex and expensive due to the large signal processing requirement and lower integration level.

FIG. 1 is a block schematic diagram of a digital audio amplifier, as described in T. O'Brien, *Digital Input Switching Audio Power Amplifier*, U.S. Pat. No. 6,107,876 (Aug. 22, 2000) the contents of which patent are incorporated herein by this reference thereto. The front end of such amplifier operates in the digital domain. One application for such type of amplifier is that of audio amplification.

FIG. 1 is a block schematic diagram of a direct digital amplifier front end according to the invention. The front end 110 receives a serial digital audio stream at an input terminal 112. The serial digital audio stream is a 1 bit digital signal. A variety of digital audio interface. standards may be used as the input signal.

The input signal is communicated to a serial interface circuit 113 that converts the serial data to parallel data at the input sampling rate. The serial data can be provided via any number of input channels. A system having one channel is shown on FIG. 1. Channel selection is accomplished through the use of any known mechanical scheme, e.g. a rotary switch, or digital selection scheme, e.g. an n-to-one multiplexer. The serial interface is not required in systems that provide a parallel digital audio signal.

The circuit output data width is determined by the input data rate. In the system of FIG. 1, a data rate of 44.1 kHz, 44 kHz, or 96 kHz may be provided. The output of the serial interface is a parallel digital audio data signal that is between 16 and 24 bits wide. The data rate and data signal width are a matter of choice as is appropriate for the application to which the system is put.

The volume control 114 receives the signal output from the serial interface and scales the data output from the serial interface. The output of the volume control is a digital signal that is from 24 to 32 bits wide and that has a data rate of 176 kHz to 1.5 MHz. The volume level may also be adjusted by an external control, such as a microprocessor controlled circuit, or it may be adjusted by a switch, e.g. pushbutton switches that adjust the volume up and down. Further, various signals processing functions, such as tone and equalization, could be implemented at this point. Additionally, the volume control function can readily be implemented in software, if desired.

The volume control receives a signal in the digital domain. Typically, the data are provided as a twoscomplement number, for example a 16-bit number that is multiplied by, for example, an 8-bit number to get a scaled value. The volume control operates by multiplying the signal by a certain number, which is the volume number. The volume is controlled with a pair of push buttons, up and down, which operate a counter that slowly counts up or down, based on whether the volume is to be higher or lower. Volume control operation can also be performed through an interface to a processor which can write to the front end of the amplifier to tell it where to set the volume. Finally, the volume control could be in the analog domain.

An interpolator 115 may be provided to increase the data rate of the signal provided from the volume control by adding calculated samples in between actual samples. The use of such circuits is known and understood by those skilled in the art. Additionally, the interpolator function can readily be implemented in software, if desired.

The oversampling filter 116, which receives the signal produced by the interpolator, is a low pass filter for smoothing the sample data, increasing the sample rate, or both. A typical oversampling filter is an FIR type having low pass band ripple, steep roll-off characteristics, and a cut-off frequency between 20 kHz and 40 kHz. The sample rate is typically increased to that of the output pulse width modulator rate. Additionally, the oversampling filter function can readily be implemented in software, if desired.

A linearizer 117 receives the signal produced by the oversampling filter and corrects for the errors produced by discrete-time pulse width modulation versus analog type pulse width modulation. A simple linearizer uses linear interpolation to determine where a linear ramp crosses the interpolated signal. The interpolation can be performed on multiple sample cycles with a single pulse width modulation cycle for increased accuracy. While shown on FIG. 1, the linearizer is not required. Additionally, the linearizer function can readily be implemented in software, if desired.

A noise shaper 118 is used to convert the signal from the linearizer (if provided) or the oversampling filter (if no linearizer is included in the circuit) to a lower resolution. The clock rates required for high fidelity audio in pulse width modulators is extremely high. The required clock rate is lowered by limiting the output time resolution. Conversion to a lower resolution by simply truncating the data causes an unacceptable increase in the noise floor. To compensate for this, the noise shaper shifts the data by adding a moving offset to the incoming data. This allows for lower noise in the audio range and higher noise above the audio range. The noise shaper consists of one or more error integrators inside a feedback loop. The loop accumulates output errors that result from truncating the data. Additionally, the noise shaper function can readily be implemented in software, if desired.

A pulse width modulator 119 creates a pulse stream that is equivalent in level to the input value. The pulse width modulator uses a high speed clock signal and linear ramp signal. The ramp signal value is compared with the input data to produce the pulse stream. The modulation technique used in the system is not limited to straight pulse width modulation and includes variations to regular pulse width modulation that are optimized for audio amplification.

A delay timing control circuit 120 may be provided if the pulse width modulator output signal requires timing adjustment before it is used to drive the power output section 121. This adjustment is necessary because of the limitations of practical power switching devices. For example, dead time is often used to avoid cross conduction in the output stage of the amplifier.

The output power section 121 couples the low level signals from the front end eventually to the speaker 122, i.e. the final output, through power switching devices (not shown) that are connected to the system power supply (not shown). The power switching devices drive the speaker through a passive low pass filter (not shown). This filter is used to remove the switching frequency from the pulse width modulator output. The power switching devices are power MOSFET drivers that are driven by the front end 110. The accuracy of the power output section is extremely important to the end system performance.

A phase locked loop 123 is used to create a stable, low jitter clock 124 which is synchronized to the incoming data to run the system. The phase locked loop may be incorporated into the front end if desired.

The power output section of the system is driven by a power supply voltage. Varying that power supply voltage also varies the output signal volume.

Such an application of this type of amplifier requires that power amplification be provided. Only one channel of operation is described in the above referenced patent application. However, for audio applications it is generally desired to provide such amplifier in the form of a multi-channel system. In such system, the signal processing capabilities of the amplifier, as well as the amplifier's sound reproduction quality, are critical.

It is desirable to separate the time at which switching between the different channels occurs, so that the noise that is generated from one channel does not leak into (or is not induced into) another channel. Such consideration increases the need for robust power supply filtering to drive the amplifier, and thus increases the cost of the amplifier.

It would be advantageous to provide a multi-channel amplification system in which a mechanism is provided to reduce or eliminate such noise without requiring a bulky and expensive power supply.

SUMMARY OF THE INVENTION

The invention implements a multi-channel amplification system in which a mechanism is provided to reduce or eliminate noise that is generated from one channel does not leak into (or is not induced into) another channel, without requiring a bulky and expensive power supply. In the preferred embodiment of the invention, pulse width modulator outputs of the amplifier channels are staggered in time such that at idle only one channel switches states at a time. This is done to provide an even draw from the power supply, assuming that the same supply is used for the multiple channels. For example, in a two channel system, the idle state of the pulse width modulator for the first channel is 90 degrees out of phase with the pulse width modulator output of the second channel. Thus, the idle crossing for one channel occurs at the same time the other channel is drawing maximum power from the power supply.

DETAILED DESCRIPTION OF THE INVENTION

The invention provides a method and apparatus for implementing multi-channel digital amplification systems. In particular, the invention provides a technique that offsets the phase of each of the channels and that offsets the phase of the processing of each of the channels as well. The invention switches the separate channels at different times. Because it is desirable to run all the channels at the same frequency, the output of the amplifier from channel to channel is offset in phase, such that the load placed upon the power supply is evenly distributed amongst the channels.

Figure 2:
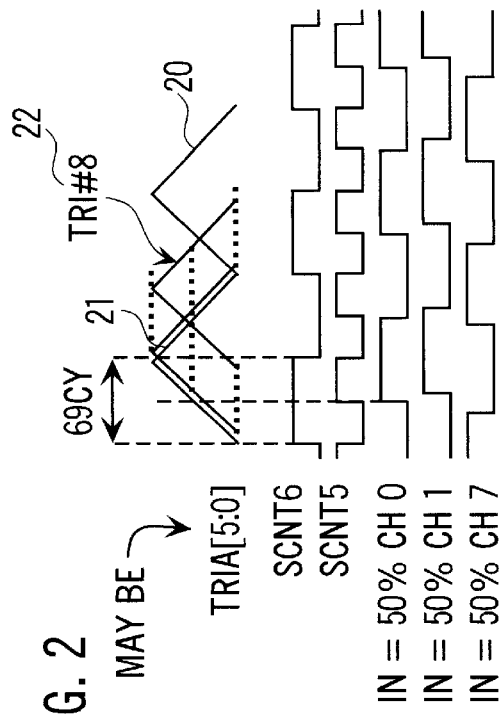
FIG. 2 is a timing diagram showing the timing for a multi-channel (eight channel) amplification system according to the invention.

FIG. 2 is a timing diagram showing the timing for a multi-channel (eight channel) amplifier according to the invention. In FIG. 2, there is shown a first triangle wave 20, a second triangle wave 21, a series of dots which indicate third through seventh triangle waves, and an eighth triangle wave 22. These triangle waves provide a referenced digital triangle wave that is internal to the system, where there is one triangle wave for each channel. The corresponding channel timing controls are shown at the bottom of FIG. 2. Eight different triangle waves are shown in FIG. 2 because there is a phase offset between the waves of one-sixteenth of a cycle for each channel in the amplifier. If the total offset is more than half a cycle, then each wave overruns into the second switching period of the next channel and the amplifier does not function properly.

Figure 1:
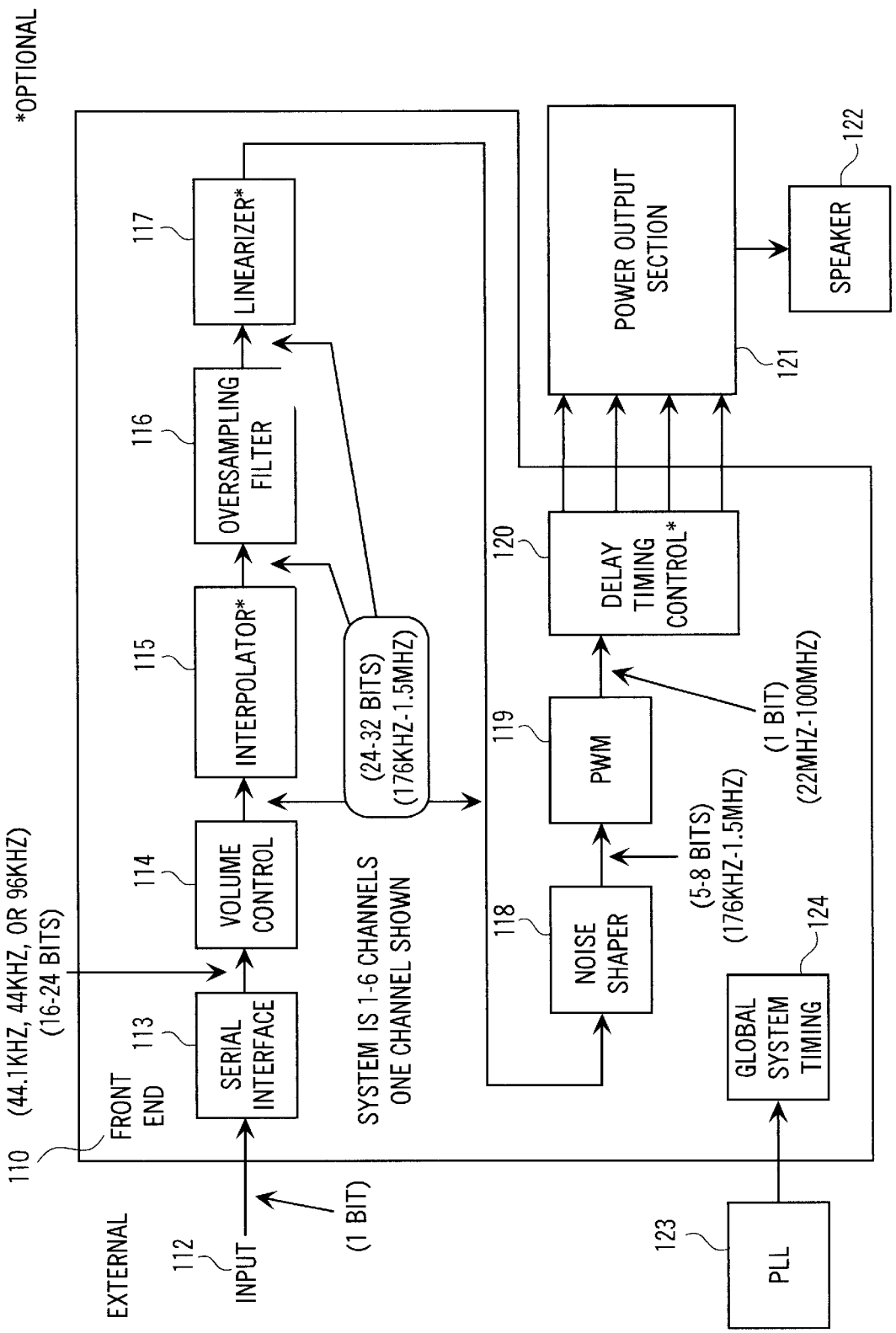
FIG. 1 is a block schematic diagram of a digital audio amplifier, as described in T. O'Brien, Digital Input Switching Audio Power Amplifier, U.S. Pat. No. 6,107,876 (Aug. 22, 2000)
Figure 3:
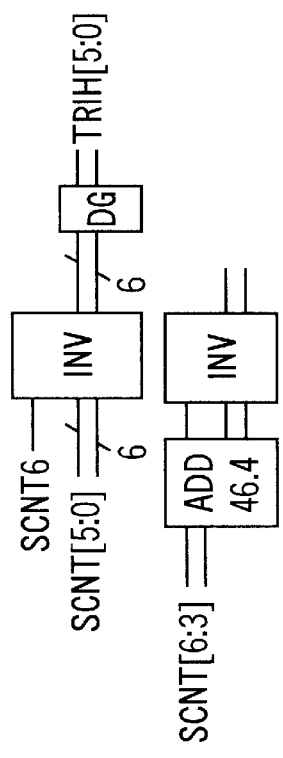
FIG. 3 is a block schematic diagram of a wave generator that may be used to generate the triangle waves shown in FIG. 2 according to the invention.
Figure 4:
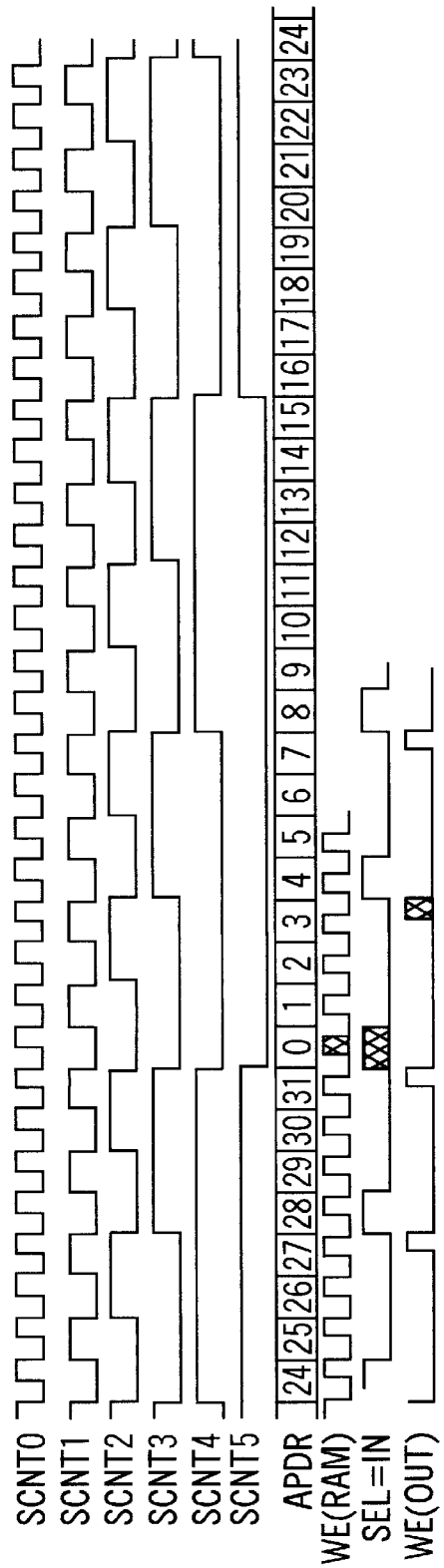
FIG. 4 is a timing diagram showing the timing signals that are used to operate the multi-channel amplifier of FIGS. 2 and 3 according to the invention.

A wave generator that may be used to implement such triangle waves is shown in FIG. 3, while the timing signals that are used to operate the amplifier are shown in FIG. 4.

A two channel amplifier operates in a similar fashion to that of quadrature modulation. That is, one channel is switched 90 degrees out of phase with the other channel (see FIGS. 5–8). For four channels, each channel is shifted 45 degrees relative to each preceding channel, and so on.

Figure 5:
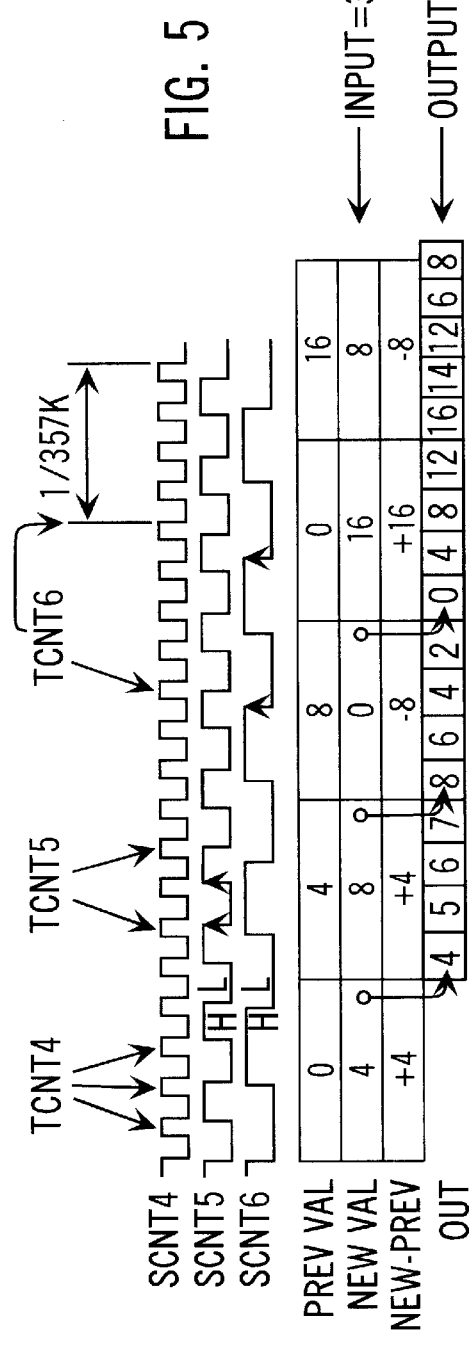
FIG. 5 is a timing diagram that illustrates the operation of a two-channel quadrature modulator according to the invention.
Figure 6:
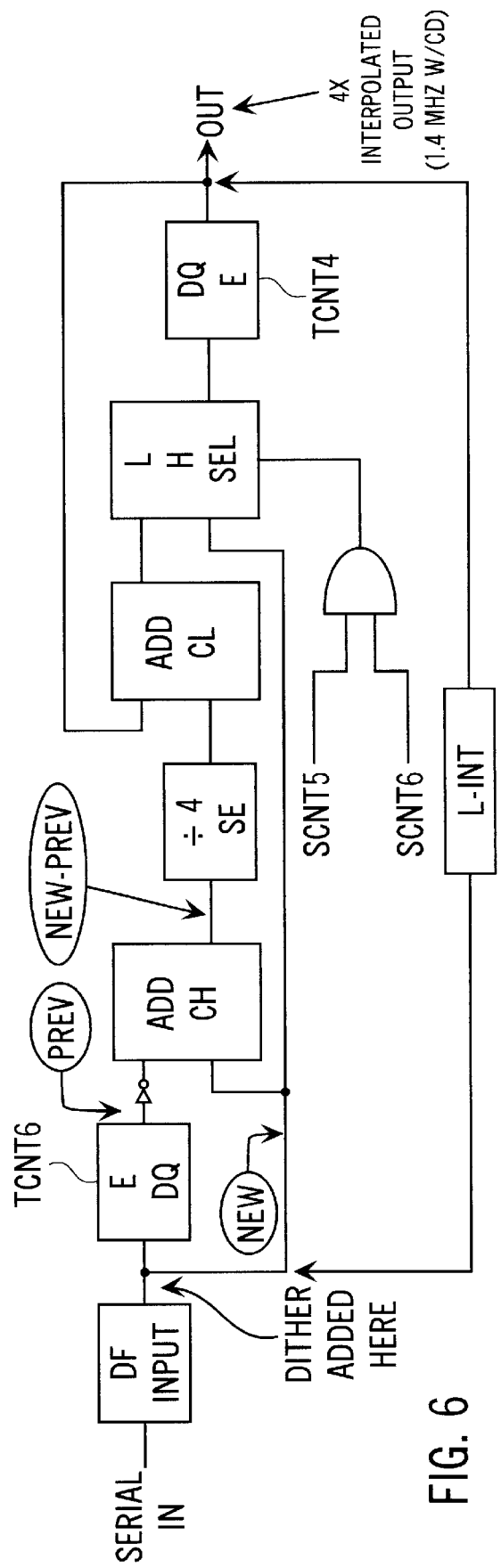
FIG. 6 is a block schematic diagram showing an implementation of a timing circuit for a two channel amplifier according to the invention.

FIG. 5 is a timing diagram that illustrates the operation of a two-channel quadrature modulator, and FIG. 6 is a block schematic diagram showing an implementation of a timing circuit for a two channel amplifier according to the invention. For purposes of understanding the operation of this embodiment of the invention, it should be appreciated that a similar technique is applied in a one-channel quadrature modulator, as is applied in a two-channel regular modulator in which both channels are offset by 90 degrees. Quadrature modulation is used in this embodiment of the invention because it effectively doubles the sample rate of the system, without increasing the clock rate. However, this involves using nearly twice as much logic per channel, but as gates become less expensive, this approach becomes more practicable.

Figure 7:
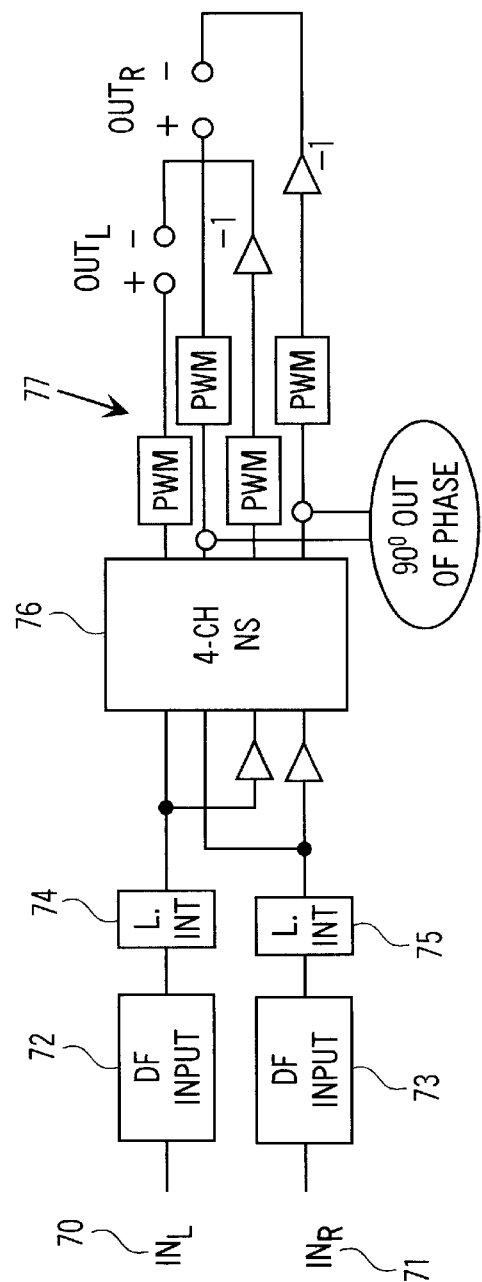
FIG. 7 is a block diagram showing a two channel amplifier according to the invention.
Figure 8:
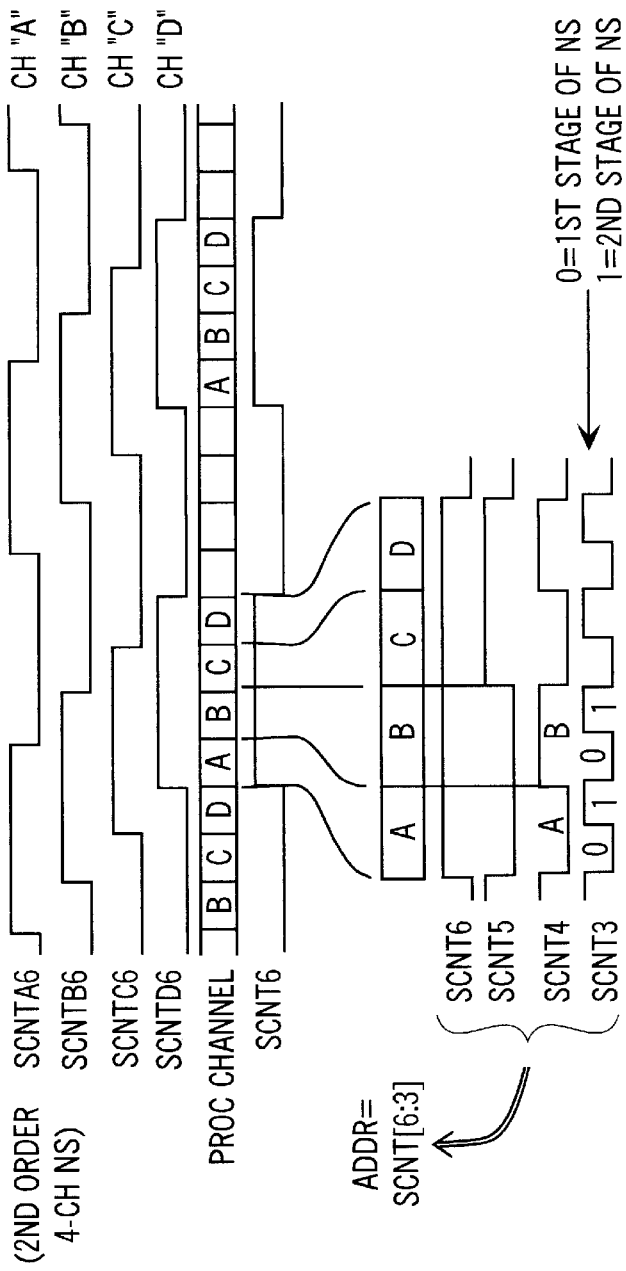
FIG. 8 is a timing diagram of the two channel amplifier of FIG. 7 according to the invention.

Referring now to FIGS. 7 and 8, two inputs 70/71, Input L and Input R, are provided into respective digital filters (DF) 72/73. For each input there is a linear interpolator 74/75, L_INT, which effectively doubles the sample rate. The output of the linear interpolators is coupled to a four-channel noise shaper 76 which runs as the previously described multi-channel system where the channels offset in phase. The inputs of every other channel in the four-channel noise shaper are inverted, i.e. they are multiplied by negative one.

As a result, the signal on each channel of the four channel noise shaper is 45 degrees out of phase on half of the channel, which is driving a half bridge 77; and the signal on each channel is in phase on the other half of the channel. Accordingly, there are two channels with double the sample rate each. Even though the system requires a four-channel noise shaper, those skilled in the art will appreciate that it is relatively straightforward to implement the invention using such multi-channel noise shapers.

Figure 9A:
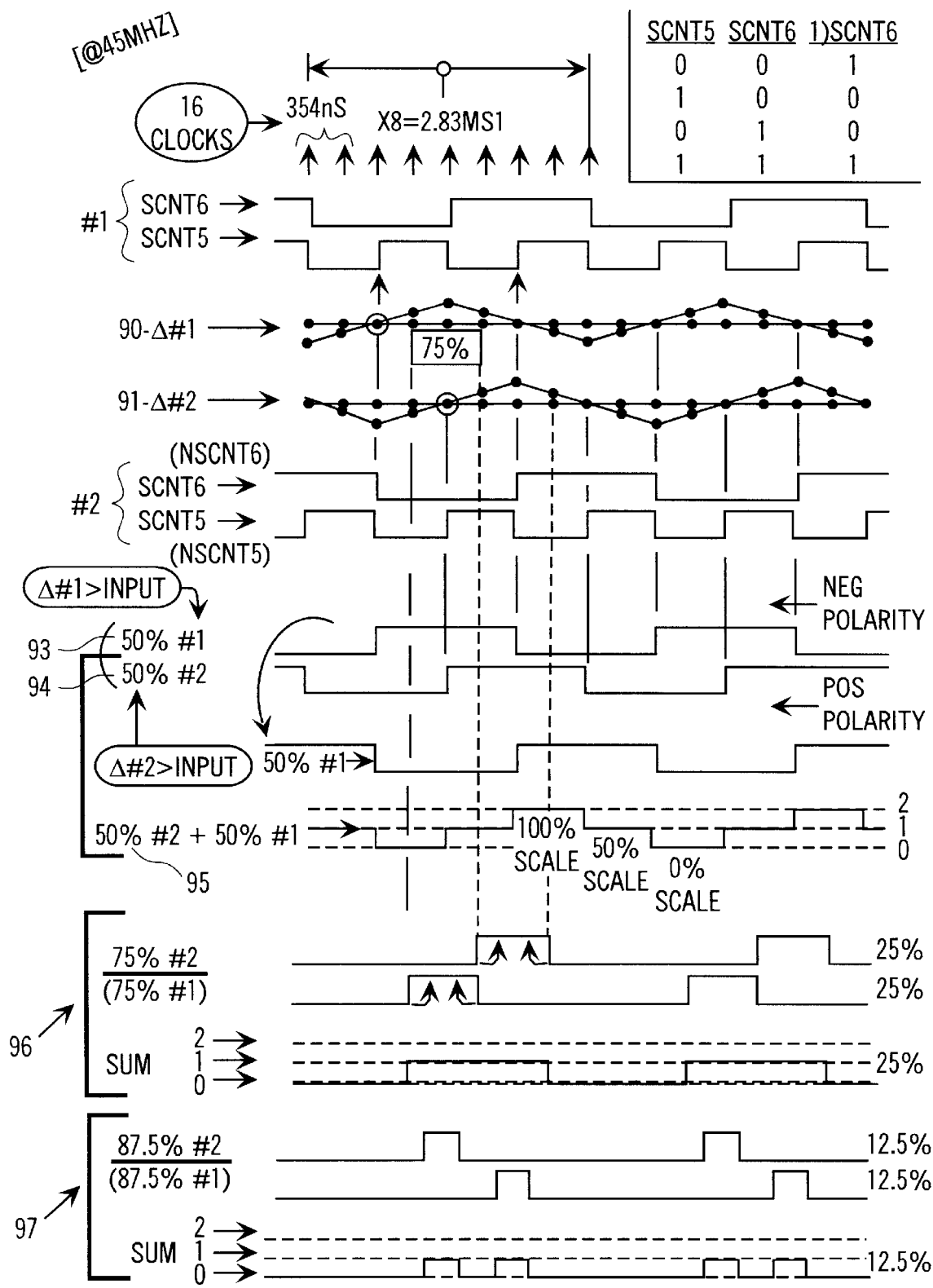
FIG. 9 is a detailed timing diagram showing quadrature modulation according to the invention.

FIG. 9 provides a more detailed timing diagram showing quadrature modulation in accordance with the invention. In FIG. 9, two triangle waves 90/91 are shown 90 degrees out of phase with each other. A 50% duty cycle output 93/94 is also shown. FIG. 9 also includes a waveform 95 for 50% number 2 plus 50% number 1, where the 50% number 1 has a bar over its top. This waveform shows the negative side of the output device, e.g. a speaker, driven with one 50% duty cycle waveform at idle, and the other side of the output device driven with another 50% duty cycle waveform. Thus, the signals at the positive side of the speaker and at the negative side of the speaker add up. It can be seen that this arrangement results in a waveform that has three levels instead of two levels.

As the levels cross, i.e. the level of the audio signal goes up and down, the levels start to go into each other (see the waveforms for a 75% duty cycle 96 and for an 87.5% duty cycle 97. The sum of the two channels is added together. That is, the positive signal of one channel and negative signal of the other channel are added together, where each side of the channels is modulated in a way that is out of phase with the other.

One problem with this approach is that any noise that is present in a half channel is added to the noise of another half channel. This could effectively double the noise in some cases. However, if the output stage is designed properly, this approach effectively doubles the sample rate which has more of a positive effect than the negative effect of the added noise.

Figure 10:
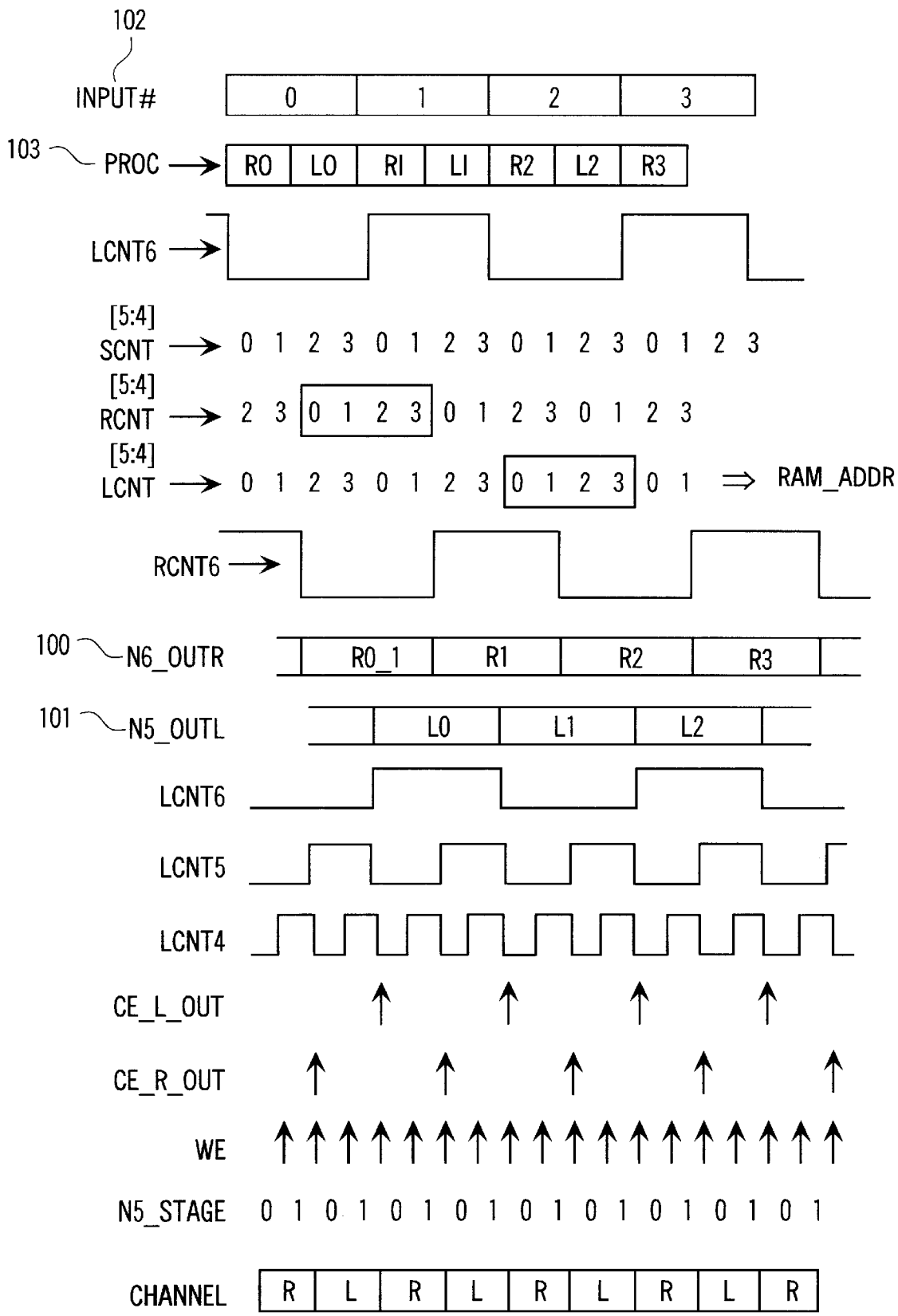
FIG. 10 is a timing diagram for a two-channel system according to the invention.

FIG. 10 is a timing diagram for a two-channel system. The two channels are run out of phase with each other, but they are not running in quadrature. Accordingly, only a two-channel noise shaper is required. FIG. 10 shows the output signals NS_OUT L 100 and NS_OUT R 101. The top line of that input number 102 shows which sample number is input. The process line 103 shows which channel and which sample of which channel is being processed at the time because they can only be processed one at a time if the system is implemented with a sequencer. Alternatively, all the channels could be processed in parallel, although it is more expensive to produce a device that does so.

Figure 11:
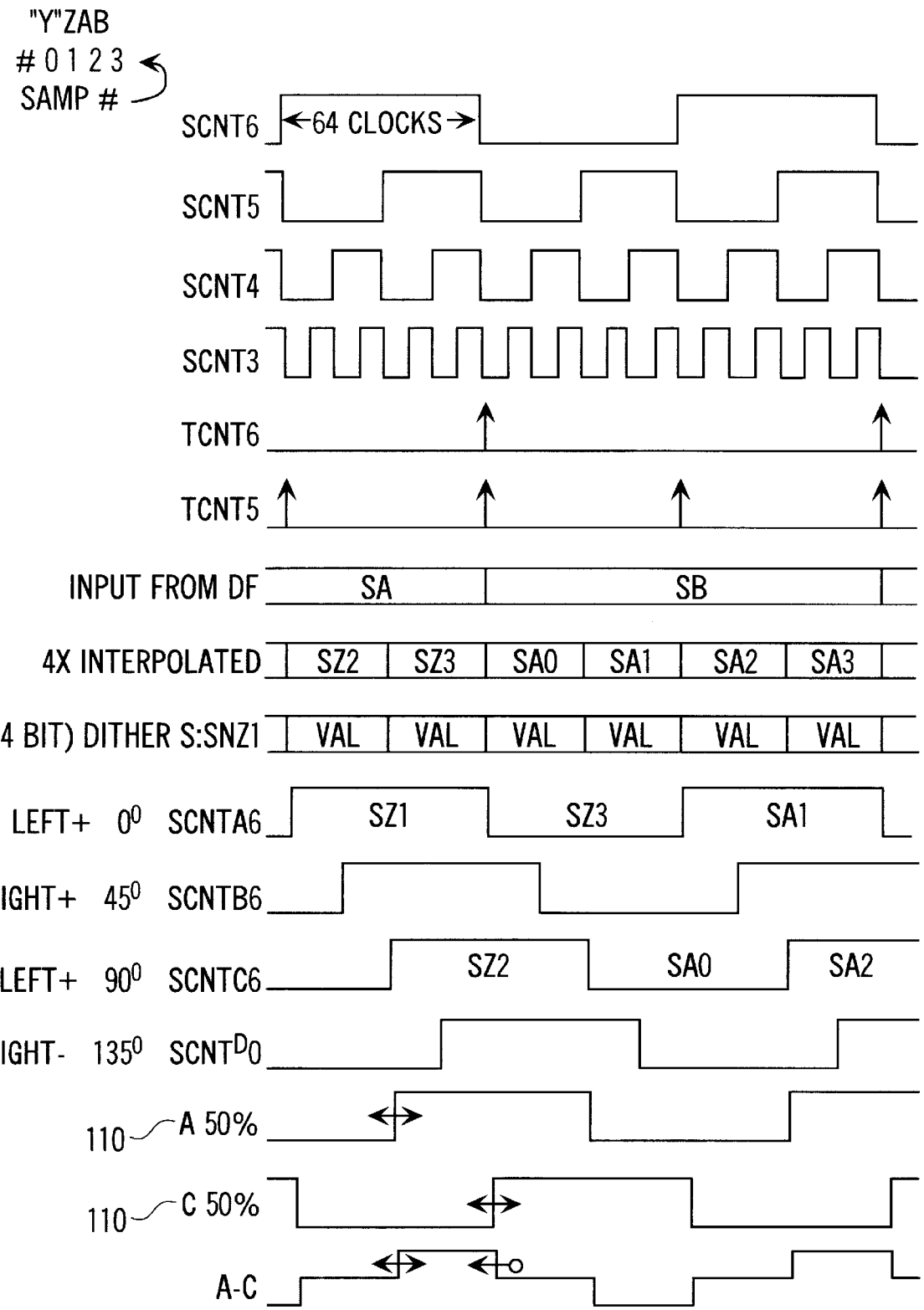
FIG. 11 is a timing diagram showing the two-channel quadrature modulation scheme in greater detail according to the invention.

FIG. 11 is a timing diagram showing the two-channel quadrature modulation scheme in greater detail. Shown on FIG. 11 is a 50% output 110.

Figure 12:
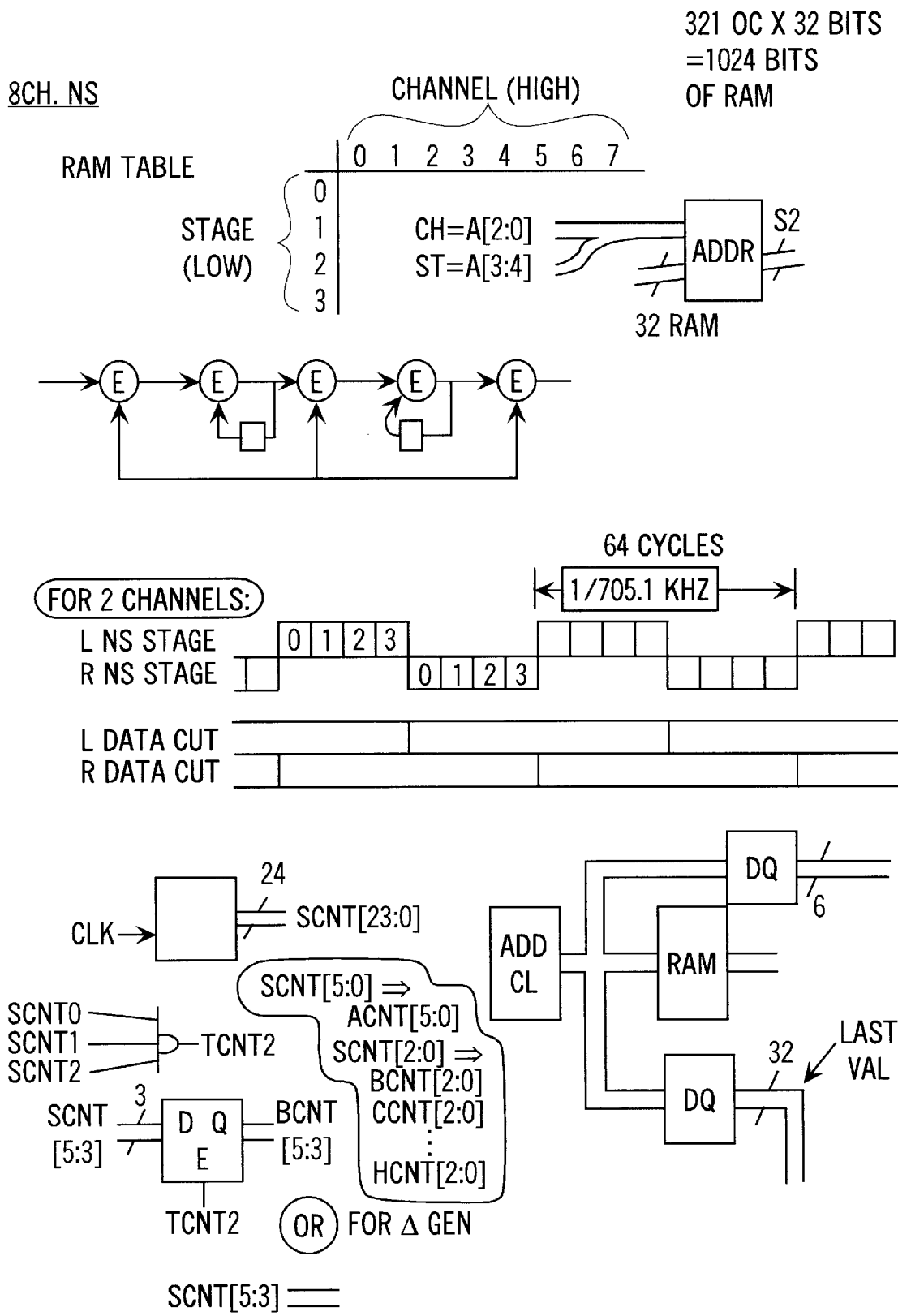
FIG. 12 is a timing diagram showing an eight-channel noise shaper that operates with all the channels out of phase with each other according to the invention.

FIG. 12 is a block schematic diagram that shows an eight-channel noise shaper that operates with all the channels out of phase with each other. FIG. 12 also shows a RAM table which stores the coefficients of the noise shaper, such that when the sequencer runs it is running eight times as fast as a single channel. When the noise shaper is processing each channel, the phase of each channel's signal follows the phase of its associated triangle wave.

Figure 13A:
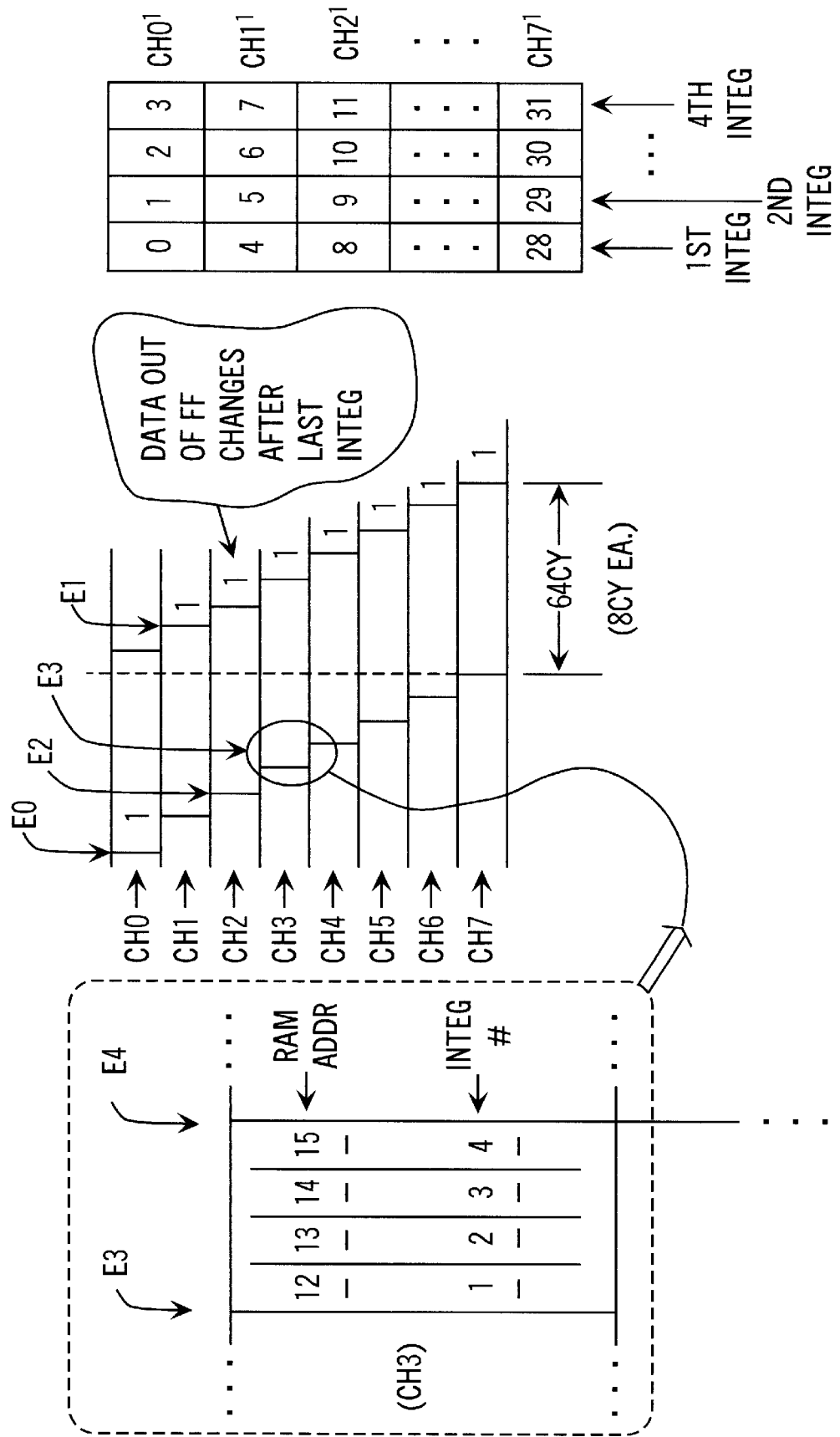
FIG. 13 is a block diagram showing an eight-channel noise shaper according to the invention.
Figure 13B:
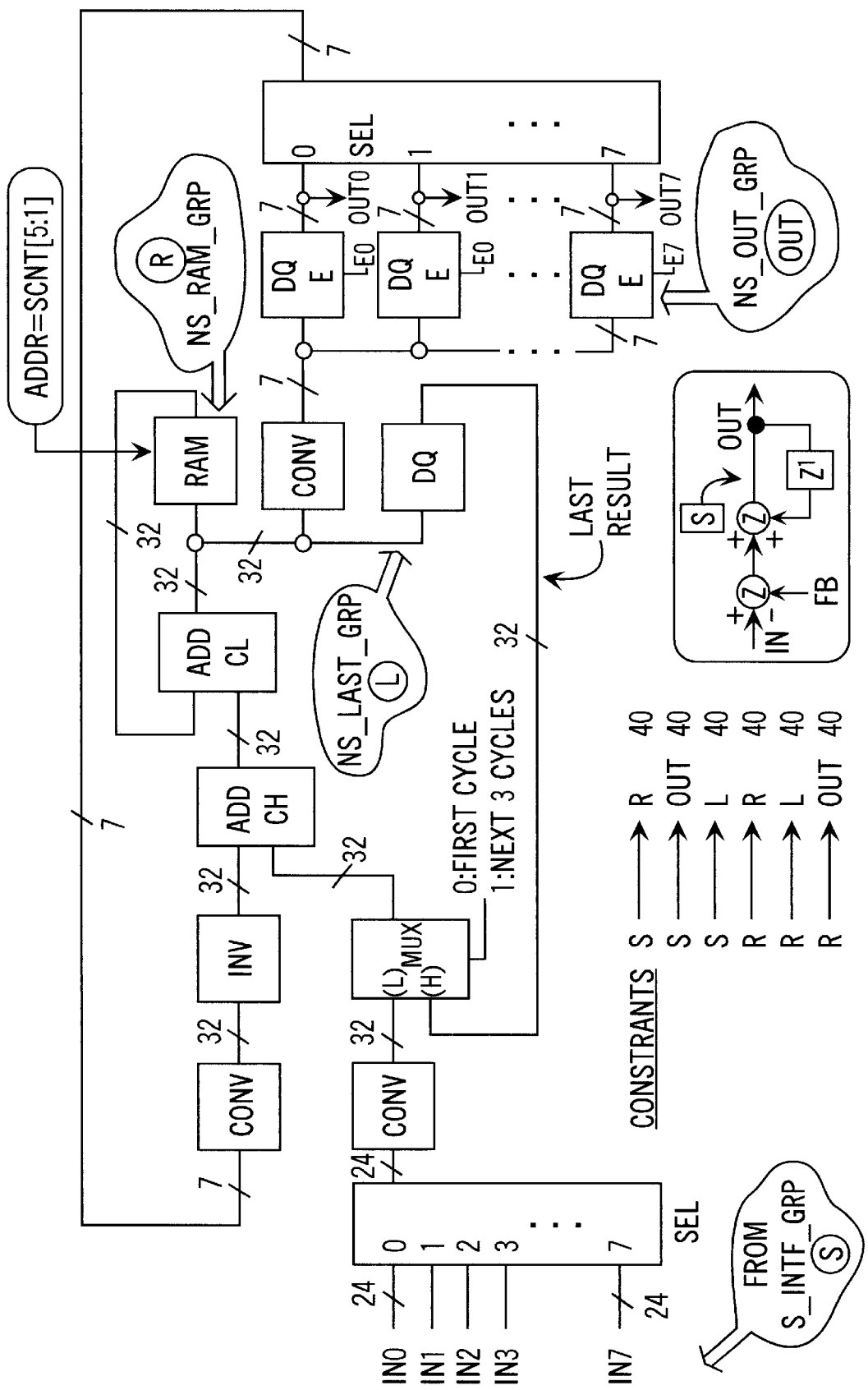
Figure 14A:
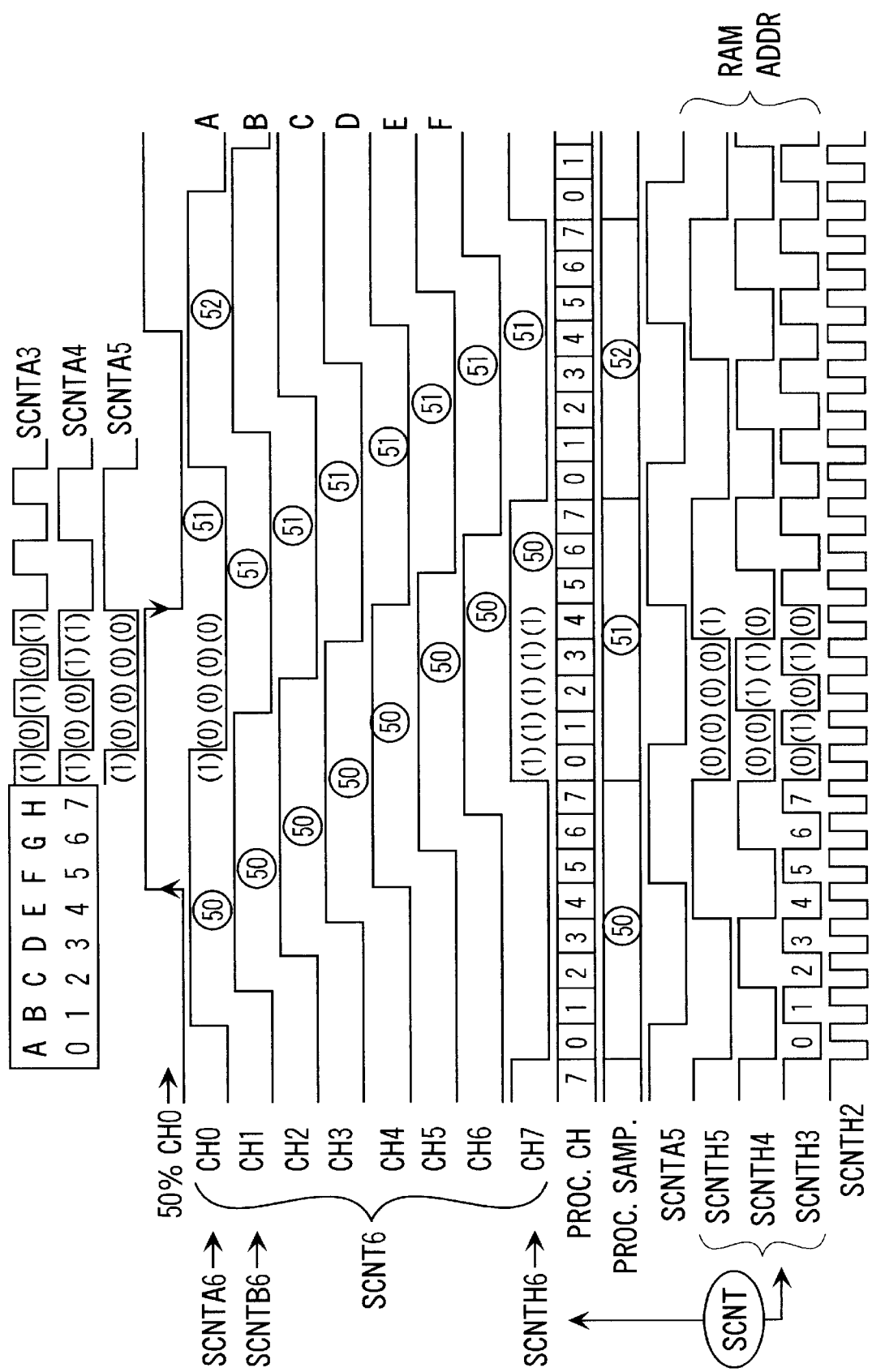
FIG. 14 is a timing diagram showing a detailed view of the timing of the eight-channel system of FIG. 13 according to the invention.

FIG. 13 is a block schematic diagram of an eight-channel noise shaper, and FIG. 14 is a timing diagram showing a detailed view of the eight-channel system timing, as well as binary numbers which represent the states of the counters for each channel. In the presently preferred embodiment of the invention, each channel has its own counter that is driven from the noise shaper. The noise shaper processes the channels and resets the counters on the channels as it processes each channel. This automatically aligns all the triangle waves.

Although the invention is described herein with reference to the preferred embodiment, one skilled in the art will readily appreciate that other applications may be substituted for those set forth herein without departing from the spirit and scope of the present invention. Accordingly, the invention should only be limited by the Claims included below.

What is claimed is:

1. A multi-channel digital amplification system, comprising:

a digital amplifier front end for each channel in said system;

a switching facility for offsetting the phase of each of said channels and for offsetting the phase of processing for each of said channels, wherein said switching facility switches each of said channels at a different time; and said switching facility comprising a multi-channel noise shaper for receiving inputs, wherein said inputs of every other channel of said multi-channel noise shaper are inverted, wherein each output signal of each channel of said multi-channel noise shaper is out of phase on half of a respective channel, and wherein said output signal on each channel of said multi-channel noise shaper is in phase on another half of said respective channel.

2. The system of claim 1, wherein said switching facility further comprises:

a wave generator for generating a reference wave for each of said channels.

3. The system of claim 2, wherein each said reference wave is a triangle wave.

4. The system of claim 1, wherein the total offset provided by said switching facility for all of said channels is less than or equal to one half of a cycle.

5. The system of claim 1, wherein said switching facility further comprises: a quadrature modulator.

6. The system of claim 5, wherein said quadrature modulator substantially doubles the sample rate of said system, without substantially increasing a system clock rate.

7. In a multi-channel digital amplification system, comprising a digital amplifier front end for each channel in said system, a switching facility for offsetting the phase of each of said channels and for offsetting the phase of processing for each of said channels, said switching facility comprising:

two or more inputs;

two or more respective digital filters for receiving signals from said two or more inputs;

a linear interpolator for each input which substantially doubles a system sample rate;

a multi-channel noise shaper for receiving the output of said linear interpolators, wherein the inputs of every other channel of said multi-channel noise shaper are inverted, wherein each output signal of each channel of said multi-channel noise shaper is out of phase on half of a respective channel, and wherein said output signal on each channel of said multi-channel noise shaper is in phase on another half of said respective channel.

8. The system of claim 7, wherein said system is a two-channel system.

9. The system of claim 7, wherein said noise shaper is a two-channel noise shaper.

10. The system of claim 7, further comprising:

a sequencer for processing said channels sequentially.

11. The system of claim 7, further comprising:

a parallel processor for processing said channels in parallel.

12. The system of claim 7, further comprising:

a table for storing coefficients of said noise shaper.

13. The system of claim 7, further comprising:

a counter for each channel that is driven from said noise shaper, wherein said noise shaper processes each channel and resets a counter for each channel as it processes each channel.

14. A multi-channel direct digital amplifier, comprising: each channel of said amplifier comprising:

an input terminal for receiving a digital audio stream;

an oversampling filter in communication with said input terminal for smoothing sample data, increasing sample rate, or both;

a noise shaper in communication with said oversampling filter for lowering signal resolution by shifting incoming data provided thereto by adding a moving offset to said data to provide lower noise in the audio range and higher noise above the audio range; and a pulse width modulator in communication with said noise shaper for creating a pulse stream that is equivalent in level to an input value;

wherein said pulse width modulator provides an output that is used to drive an output power element which, in turn, drives a sound reproduction device; and further comprising:

a switching facility for offsetting the phase of each of said channels and for offsetting the phase of processing for each of said channels.

15. A method for amplifying a digital signal in a multi-channel amplifier, comprising the steps of:

for each channel:

converting said digital signal from a low-frequency, high bit rate signal to a high-frequency, narrow signal; and producing a bit value that creates an output from said amplifier that is recognized in the analog domain;

wherein each digital bit output represents a portion of an analog waveform that is to be reproduced by a reproduction device; and offsetting the phase of each of said channels; and offsetting the phase of processing for each of said channels.

16. A multi-channel digital amplification process, comprising the steps of:

providing a digital amplifier front end for each channel in said system;

providing a switching facility for offsetting the phase of each of said channels and for offsetting the phase of processing for each of said channels, wherein each of said channels is switched at a different time; and said switching facility comprising a multi-channel noise shaper for receiving inputs, wherein said inputs of every other channel of said multi-channel noise shaper are inverted, wherein each output signal of each channel of said multi-channel noise shaper is out of phase on half of a respective channel, and wherein said output signal on each channel of said multi-channel noise shaper is in phase on another half of said respective channel.

17. The process of claim 16, further comprising the step of:

generating a reference wave for each of said channels.

18. The process of claim 17, wherein each said reference wave is a triangle wave.

19. The process of claim 16, wherein the total offset for all of said channels is less than or equal to one half of a cycle.

20. The process of claim 16, wherein said offsetting steps are performed by a quadrature modulator.

21. The process of claim 20, wherein said quadrature modulator substantially doubles the sample rate of said system, without substantially increasing a system clock rate.

22. In a multi-channel direct digital amplifier, where each channel of said amplifier comprises at least a pulse width modulator for creating a pulse stream that is equivalent in level to an input value, a multi-channel digital amplification process, comprising the steps of:

providing a digital amplifier front end for each channel in said system;

staggering pulse width modulator outputs in time such that at idle only one channel switches states at a time; and providing a multi-channel noise shaper for receiving inputs, wherein said inputs of every other channel of said multi-channel noise shaper are inverted, wherein each output signal of each channel of said multi-channel noise shaper is out of phase on half of a respective channel, and wherein said output signal on each channel of said multi-channel noise shaper is in phase on another half of said respective channel.

23. In a multi-channel direct digital amplifier, where each channel of said amplifier comprises at least a pulse width modulator for creating a pulse stream that is equivalent in level to an input value, a multi-channel digital amplification system, comprising:

a digital amplifier front end for each channel in said system;

a module for staggering pulse width modulator outputs in time such that at idle only one channel switches states at a time; and a multi-channel noise shaper for receiving inputs, wherein said inputs of every other channel of said multi-channel noise shaper are inverted, wherein each output signal of each channel of said multi-channel noise shaper is out of phase on half of a respective channel, and wherein said output signal on each channel of said multi-channel noise shaper is in phase on another half of said respective channel.

* * * * *